(12) United States Patent
Yoshimura

(10) Patent No.: US 6,198,322 B1
(45) Date of Patent: Mar. 6, 2001

(54) DUTY-RATIO CORRECTION CIRCUIT AND CLOCK GENERATION CIRCUIT

(75) Inventor: Tsutomu Yoshimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/246,686

(22) Filed: Feb. 9, 1999

(30) Foreign Application Priority Data

Aug. 24, 1998 (JP) .................................................. 10-237423

(51) Int. Cl.$^7$ .................................................. H03K 3/017
(52) U.S. Cl. .................. 327/175; 327/170; 327/153; 327/155; 327/298; 327/536
(58) Field of Search .................. 327/153, 155, 327/157, 170, 175, 292, 299, 536

(56) References Cited

U.S. PATENT DOCUMENTS 5,907,254 * 5/1999 Chang .................................. 327/165

OTHER PUBLICATIONS

Raghunand Bhagwan et al., "A 1 GHz Dual–Loop Microprocessor PLL with Instant Frequency Shifting," International Solid–State Circuits Conference, 1997, pp. 336 and 337.

* cited by examiner

Primary Examiner—Kenneth B. Wells
Assistant Examiner—Cassandra Cox
(74) Attorney, Agent, or Firm—Burns, Doane, Swecker & Mathis, LLP

(57) ABSTRACT

A duty ratio can be corrected to 1:1 without affecting the operation of a PLL or DLL circuit. A rising-edge control circuit (1a) generates a signal (S10) by inverting a signal (S6), and varies a time required for a high to low transition of the signal (S10). A comparator (A1) causes a transition of a signal (S2) when the signal (S10) becomes less than a reference value (Vref), so the duty ratio of the signal (S2) varies according to the length of its fall time. A duty-ratio detecting circuit (2) is a charge pump for drawing or passing a constant amount of current according to a voltage of the signal (S2). A duty-ratio correction filter (3) converts a signal (S8) obtained from the duty-ratio detecting circuit (2) into a smooth voltage signal (S9). This signal (S9) becomes a feedback signal to the rising-edge control circuit (1a) for correcting the duty ratio of the signal (S2) to 1:1.

20 Claims, 13 Drawing Sheets

DUTY-RATIO CORRECTION CIRCUIT AND CLOCK GENERATION CIRCUIT

BACKGROUND OF THE INVENTION

1. Field of the Invention

The present invention relates to a PLL or DLL circuit, especially to a circuit for controlling a duty ratio of a signal.

2. Description of the Background Art

When an input clock signal having a high period/low period ratio or duty ratio of one to one is fed to a circuit, the duty ratio may deviate from 1:1 inside the circuit, for example, due to the level of the input clock signal or the characteristics of an input buffer. Further, in some cases, the duty ratio of the input clock signal which is generated in the PLL or DLL circuit may not be 1:1 due to imperfect oscillation characteristics of a voltage controlled oscillator or a delay stage.

With the duty ratio of other than 1:1, a problem will arise, for example, when both rising and falling edges of the input clock signal are used as timing signals for the operation of logic elements in the circuit. More specifically, the deviation of the duty ratio from 1:1 increases the risk that a time when an element starts its operation at the rising edge may coincide with a time when the element starts its operation at the falling edge. This causes a shortage of timing margins.

FIG. 13 shows circuitry for correcting the duty ratio of the clock signal to 1:1, which resolves the above problem. This circuitry is designed to incorporate a duty-ratio correction circuit DRC3 into a well-known PLL circuit PLL1, disclosed for example in R. Bhagwan and A. Rogers, "A 1 GHz Dual-Loop Microprocessor PLL with Instant Frequency Shifting", ISSCC Digest of Technical Papers, pp. 336–337, February, 1997.

First, we will describe the operation of the PLL circuit PLL1. An input clock signal S1 and a feedback clock signal S2 are frequency-divided by frequency dividers CD1 and CD2, respectively, and fed to a phase-frequency detector 6. The phase-frequency detector 6 detects a coincidence or phase difference between those signals and outputs a signal S3 for indicating the intensity of voltage which is responsive to the detection result, to a charge pump 7. Converting the signal S3 into a current signal S4, the charge pump 7 acts as a charge supply source for a loop filter 8. The loop filter 8 includes a capacitor C3 whose one end is connected to a power source VDD (showing the potential at that end also as "VDD"), so the potential of the other end is smoothed to be a signal S5 to a voltage controlled oscillator 5. The signal S5 varies an oscillation period and a phase of a signal S6 output from the voltage controlled oscillator 5.

In a standard PLL circuit, the signal S6 directly becomes the feedback clock signal S2. In the circuitry in FIG. 13, on the other hand, the signal S6 is fed to the duty-ratio correction circuit DRC3. Then, a signal S7 outputted from the duty-ratio correction circuit DRC3 becomes the feedback clock signal S2 through a buffer B1.

Next, we will describe the duty-ratio correction circuit DRC3. The duty-ratio correction circuit DRC3 consists of a level shifting circuit LS1, a duty-ratio detecting circuit 2, and a duty-ratio correction filter 3.

The level shifting circuit LS1 varies a threshold value of the signal S6 for determining the transition timing of the signal S7. By using the level shifting circuit LS1, the threshold value can be shifted from an intermediate value between high and low which is usually used as a threshold voltage. Thus, the duty ratio of the signal S6 becomes variable.

FIG. 14 is a timing chart of the operation of the level shifting circuit LS1. It shows waveforms S7a, S70, and S7b of the signal S7 when a threshold value Vref of the signal S6 is Vrefa, Vref0, and Vrefb, respectively, where Vrefa<Vref0<Vrefb.

As shown in FIG. 14, a rising edge of the signal S7 becomes earlier and a falling edge thereof becomes later with the decrease in the threshold value Vref. That is, a high period of the signal S7 increases. On the other hand, a low period of the signal S7 increases as the threshold value Vref increases.

The duty-ratio detecting circuit 2 is a charge pump for converting the signal S7 into a current signal S8, and the duty-ratio correction filter 3 is a filter including a capacitor C2 whose one end is grounded (showing the potential of that end as GND). The signal S7 is fed to the duty-ratio detecting circuit 2 to be converted into the signal S8. The signal S8 is then converted into a control signal S9 which is a smooth voltage signal, by the capacitor C2 in the duty-ratio correction filter 3. The control signal S9 is fed back to the level shifting circuit LS1, by which the amount of level shift is controlled to correct the duty ratio to 1:1.

As described so far, this circuitry comprises two feedback mechanisms, including a loop in the PLL circuit PLL1 for controlling the phase and the period and a loop in the duty-ratio correction circuit DRC3 for controlling the duty ratio to be 1:1.

In the circuitry, however, either of the two feedback mechanisms for the feedback clock signal S2 is likely to interfere with the other. Thus, it may take more time to stabilize the circuitry as compared with a case where the PLL circuit PLL1 and the duty-ratio correction circuit DRC3 are separated to operate independently.

SUMMARY OF THE INVENTION

A first aspect of the present invention is directed to a duty-ratio correction circuit comprising: an inverter with an input end receiving a clock, an output end, a first power supply end, a second power supply end, a first current source connected to the first power supply end, and a second current source connected to the second power supply end; and a comparator for comparing a potential of the output end of the inverter with a reference value to output a two-state output signal for controlling a driving force of either the first current source or the second current source.

According to a second aspect of the present invention, the duty-ratio correction circuit of the first aspect further comprises: a control signal generation circuit for generating a control signal by smoothing a variation in the output signal. The control signal controls the amount of current supplied through either of the first current source or the second current source.

According to a third aspect of the present invention, in the duty-ratio correction circuit of the second aspect, the inverter includes a plurality of inverters connected in series; and the inverter having the first current source with a variable driving force and the inverter having the second current source with a variable driving force are alternately placed.

A fourth aspect of the present invention is directed to a clock generation circuit for generating an output clock taking on first and second logical values in synchronization with a reference clock taking on the first and the second logical values. The clock generation circuit comprises: an intermediate clock generation portion for generating an intermediate clock taking on the first and the second logical values on the basis of a comparison between the reference clock and the output clock concerning a first transition from the first logical value to the second logical value; and an output clock generation portion for outputting the output clock by producing a controllable delay in a second transition from the second logical value to the first logical value of the intermediate clock.

According to a fifth aspect of the present invention, in the clock generation circuit of the fourth aspect, the output clock generation portion includes: a transition delay control circuit for generating the output clock by delaying the second transition of the intermediate clock on the basis of a control signal; and a control signal generation circuit for generating the control signal on the basis of a duty ratio of the output clock.

According to a sixth aspect of the present invention, in the clock generation circuit of the fifth aspect, the transition delay control circuit includes: an inverter with an input end receiving the intermediate clock, an output end, a first current source which is, when the intermediate clock takes on the first logical value, to be connected to the output end to supply a current on the basis of the control signal, and a second current source which is, when the intermediate clock takes on the second logical value, to be connected to the output end to supply a first constant current; and a comparator for comparing a potential of the output end of the inverter with a reference value to output a two-state output signal. In the circuit, a current supplied through the first current source and a current supplied through the second current source are opposite in direction at the output end of the inverter, and the output signal of the comparator serves as the output clock.

A seventh aspect of the present invention is directed to a clock generation circuit for generating an output clock taking on first and second logical values in synchronization with a reference clock taking on the first and the second logical values. The clock generation circuit comprises: a first comparator for making a comparison between the reference clock and the output clock concerning a first transition from the first logical value to the second logical value, to output a comparison result; a delay circuit with a first delay element and a second delay element, for outputting an intermediate clock on the basis of a second delay signal, the first delay element generating a first delay signal by inverting the reference clock while delaying a second transition from the second logical value to the first logical value of the reference clock by a first amount of delay based on the comparison result given by the first comparator and a first delay control signal, the second delay element generating the second delay signal by inverting the first delay signal while delaying the first transition of the first delay signal by a second amount of delay based on the comparison result given by the first comparator and a second delay control signal; a second comparator for comparing the intermediate clock with a reference value to generate the output clock; and a control signal generation circuit for generating the first and the second delay control signals on the basis of a duty ratio of the output clock.

According to an eight aspect of the present invention, in the clock generating circuit of the seventh aspect, the first delay element includes: an inverter with an input end receiving the reference clock, an output end outputting the first delay signal, a first power supply end, and a second power supply end; a first current source for supplying a current controlled by the comparison result given by the first comparator and the first delay control signal, to the first power supply end of the inverter; and a second current source for supplying a current controlled by the comparison result given by the first comparator, to the second power supply end of the inverter.

According to a ninth aspect of the present invention, in the clock generation circuit of the seventh aspect, the second delay element includes: an inverter with an input end receiving the first delay signal, an output end outputting the second delay signal, a first power supply end, and a second power supply end; a first current source for supplying a current controlled by the comparison result given by the first comparator, to the first power supply end of the inverter; and a second current source for supplying a current controlled by the comparison result given by the first comparator and the second delay control signal, to the second power supply end of the inverter.

According to a tenth aspect of the present invention, in the clock generation circuit of the ninth aspect, the control signal generation circuit includes: a smoothing circuit for smoothing and outputting the output clock; and a delay control signal generation circuit for outputting the first and the second delay control signals on the basis of a charge outputted from the smoothing circuit.

In the duty-ratio correction circuit of the first aspect, a time required for the rise or fall of the potential of the output end of the inverter is variable so that the duty ratio of the output signal of the comparator is also variable. Further, the output signal of the comparator is fed back to the inverter. This allows correction of variations in the duty ratio of the output signal of the comparator.

In the duty-ratio correction circuit of the second aspect, the variations in the duty ratio of the output signal appear as variations in the value of the control signal which is obtained by smoothing the output signal. Thus, feedback on the duty ratio can be received by controlling the amount of current supplied through either the first current source or the second current source by the control signal.

In the duty-ratio correction circuit of the third aspect, the duty ratio of the output signal can be greatly varied by controlling the amount of delay in only one of a pair of transitions of the clock.

In the clock generation circuit of the fourth aspect, a first control over the synchronization between the reference clock and the output clock and a second control over the duty ratio of the output clock are simultaneously performed by the intermediate clock generation portion and the output clock generation portion, respectively. At this time, the transitions used for those controls are different from each other, so neither of the first control nor the second control affects the other.

In the clock generation circuit of the fifth aspect, the amount of delay in the second transition of the intermediate clock is controlled on the basis of the duty ratio of the output clock. Thus, the second control can be performed to keep the duty ratio of the output clock constant.

In the clock generation circuit of the sixth aspect, only either of a charge outputted from the output end of the inverter or a charge inputted therefrom is controlled by the control signal. This allows control of a time for the potential of the output end to reach the reference value. Accordingly, the output of the comparator for comparing the potential of the output end and the reference value can be adopted as the output clock.

In the clock generation circuit of the seventh aspect, when the reference clock is delayed in order to perform the first control over the synchronization between the reference clock and the output clock, the second control over the duty ratio of the output clock is also performed. At this time, the transitions used for those controls are different from each other, so neither of the first control nor the second control affects the other. Further, the duty ratio of the output signal can be greatly varied according to the first amount of delay and the second amount of delay.

In the clock generation circuit of the eighth aspect, the amount of current outputted from the inverter of the first delay element is controlled by the comparison result given by the first comparator. This makes it possible to delay the reference clock in order to perform the first control over the synchronization between the reference clock and the output clock. Further, the amount of current outputted from the inverter of the first delay element during the first transition of the first delay signal is controlled also by the first delay control signal. Thus, the delay in the second transition of the reference clock is also based on the second control over the duty ratio of the output clock.

In the clock generation circuit of the ninth aspect, the amount of current outputted from the inverter of the second delay element is controlled by the comparison result given by the first comparator. This makes it possible to delay the reference clock in order to perform the first control over the synchronization between the reference clock and the output clock. Further, the amount of current outputted from the inverter of the second delay element during the second transition of the second delay signal is controlled also by the second delay control signal. Thus, the delay in the first transition of the reference clock is also based on the second control over the duty ratio of the output clock.

In the clock generation circuit of the tenth aspect, the charge outputted from the smoothing circuit varies according to the periods that the output clock takes on the first and the second logical values. This makes it possible to obtain the first and the second delay control signals which vary according to the duty ratio of the output clock.

Thus, an object of the present invention is to provide circuitry which can rapidly stabilize itself while controlling the duty ratio as well as the phase and the period.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
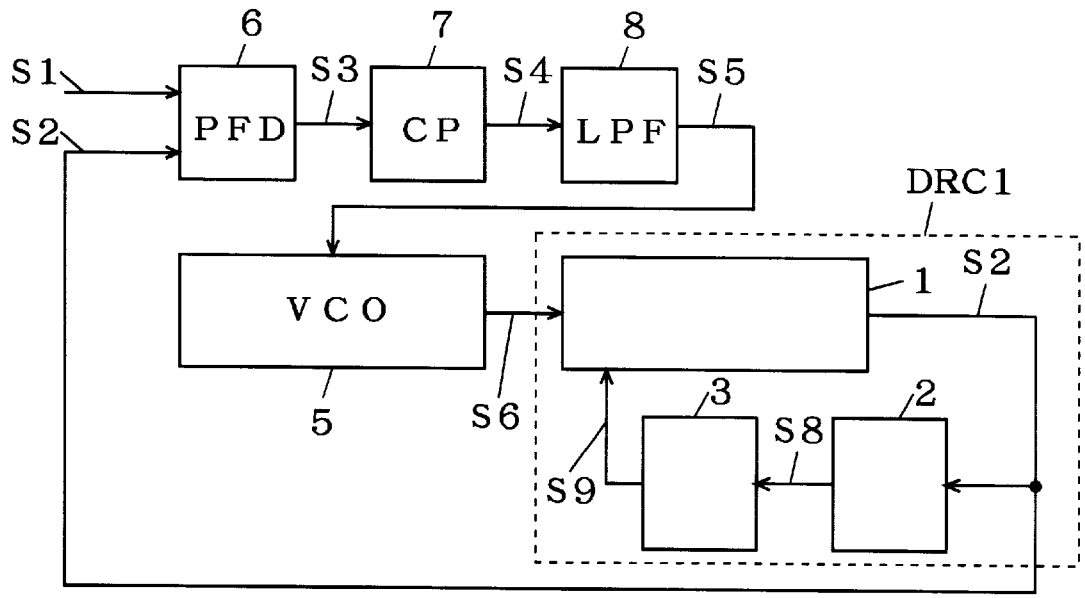
FIG. 1 shows a circuit configuration according to a first preferred embodiment of the present invention.

FIG. 1 shows the structure of a PLL circuit with a duty-ratio correction circuit DRC1 according to a first preferred embodiment of the present invention. The duty-ratio correction circuit DRC1 comprises a transition delay control circuit 1, a duty-ratio detecting circuit 2, and a duty-ratio correction filter 3. The other portion of the PLL circuit is well-known technique. More specifically, the PLL circuit of the first preferred embodiment comprises: a phase-frequency detector 6 for detecting a coincidence or phase difference between an input clock signal S1 and a feedback clock signal S2 to output a signal S3 for indicating the intensity of a voltage which is responsive to the detection result; a charge pump 7 for converting the signal S3 into a current signal S4; a low-pass filter 8 for converting the signal S4 into a smooth voltage signal S5; and a voltage controlled oscillator 5 whose oscillation characteristics are controlled by the signal S5.

In the duty-ratio correction circuit DRC1, the transition delay control circuit 1 obtains the feedback clock signal S2 by delaying one transition, e.g., a rising edge from low to high, of the signal S6 output from the voltage controlled oscillator 5, on the basis of a control signal S9. The transition delay control circuit 1 further controls a duty ratio of the feedback clock signal S2 by stabilizing the amount of delay in the other transition, e.g., a falling edge, of the signal S6.

The duty-ratio detecting circuit 2 is a charge pump for generating a current signal S8 by drawing and passing a constant amount of current during the high period and the low period of the feedback clock signal S2, respectively.

The signal S8 from the duty-ratio detecting circuit 2 is then fed to the duty-ratio correction filter 3. Through this filter, the signal S8 is turned to be a smooth voltage serving as a control signal S9.

In the duty-ratio correction circuit DRC1, as previously described, the control over the duty ratio is gained by controlling the amount of delay only in one of a pair of transitions of the signal S6. Correspondingly, the phase-frequency detector 6 uses the other of the pair of transitions of the feedback clock signal S2 for the phase and the frequency comparisons. For example, when the duty-ratio correction circuit DRC1 controls a delay in the rising edge of the signal S6 to generate the feedback clock signal S2, the phase-frequency detector 6 uses the falling edge of the input clock signal S1 and the feedback clock signal S2 for the phase and the frequency comparisons.

In the PLL circuit with the duty-ratio correction circuit DRC1 according to the first preferred embodiment, the transition used for the control over the duty ratio by the duty-ratio correction circuit DRC1 is different from the transition used for the control over the phase and the frequency by the voltage controlled oscillator 5, the phase-frequency detector 6, the charge pump 7, and the low-pass filter 8. Thus, neither feedback affects the other. Accordingly, the PLL circuit with the duty-ratio correction circuit DRC1 of the first preferred embodiment can rapidly stabilize itself while controlling both the duty ratio, and the phase and the frequency.

Figure 2:
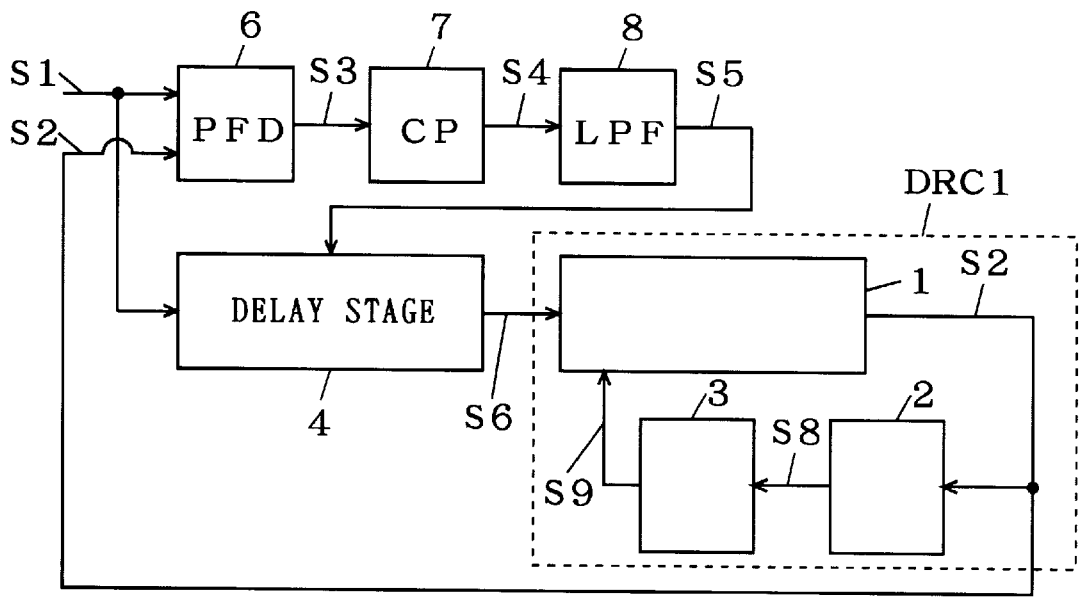
FIG. 2 shows another circuit configuration according to the first preferred embodiment.

The first preferred embodiment is also applicable to a DLL circuit. In this case, the voltage controlled oscillator 5 is substituted by a delay stage 4 controlled by the signal S5 and designed to receive the input clock signal S1 as shown in FIG. 2. In this way, the signal S6 is obtained as a delay signal of the input clock signal S1 and fed to the duty-ratio correction circuit DRC1 where the duty ratio of the signal S6 is controlled.

2. Second Preferred Embodiment

Figure 3:
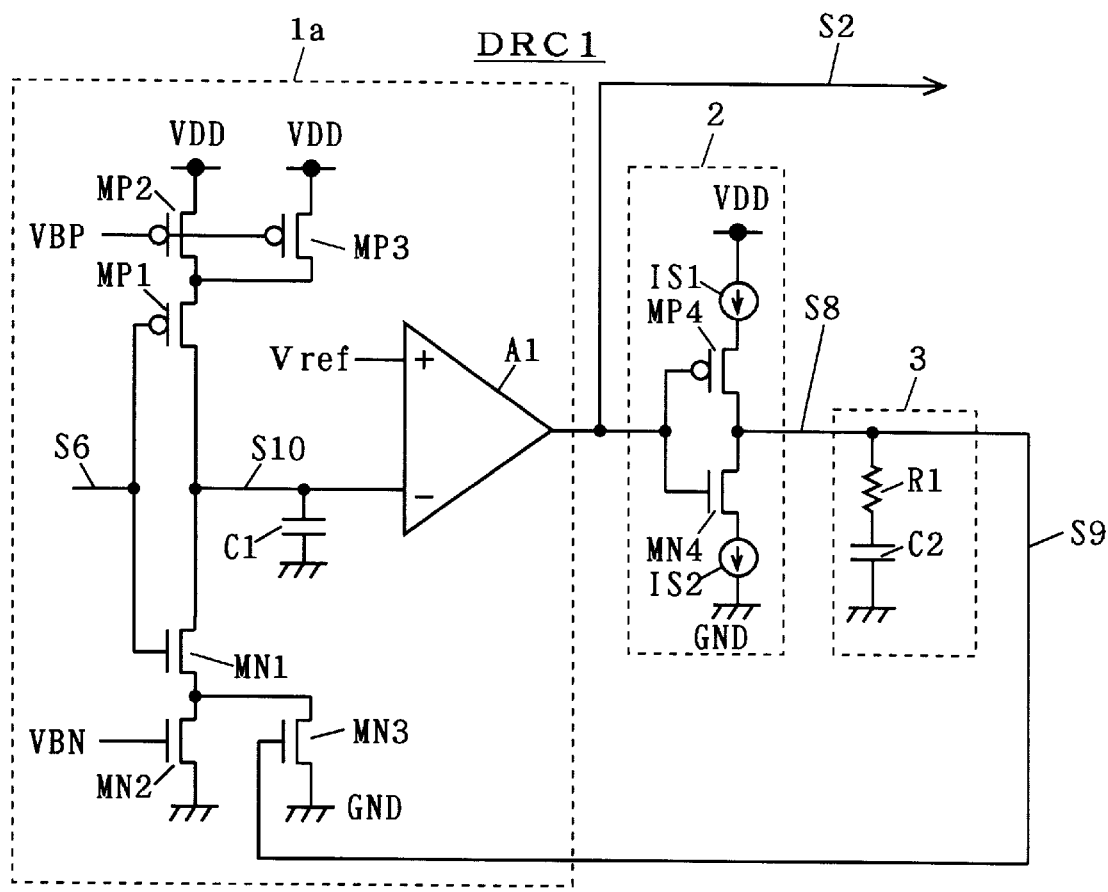
FIG. 3 shows a circuit configuration according to a second preferred embodiment of the present invention.

FIG. 3 shows an example of the structure of the duty-ratio correction circuit DRC1. In a second preferred embodiment, a rising-edge control circuit 1a is used as the transition delay control circuit 1. The rising-edge control circuit 1a has a CMOS inverter structure including a P-channel transistor MP1 and an N-channel transistor MN1. The signal S6 from the delay stage 4 or the voltage controlled oscillator 5 is fed to both gates of the transistors MP1 and MN1. The source of the transistor MP1 is connected via parallel-connected P-channel transistors MP2 and MP3 to the power supply VDD, while the source of the transistor MN1 is grounded via parallel-connected N-channel transistors MN2 and MN3. Further, a constant bias voltage VBP is applied to each gate of the transistors MP2 and MP3, and a constant bias voltage VBN is applied to the gate of the transistor MN2. The transistor MN3 receives the control signal S9 at its gate.

The transistors MP1 and MN1 are both connected at their drains to a negative input end of a comparator A1. The negative input end is grounded via a capacitor C1, and the potential thereof is shown as a signal S10. Further, a constant reference potential Vref is applied to a positive input end of the comparator A1. The comparator A1 outputs the feedback clock signal S2 from its output end. The feedback clock signal S2 is high when the potential of the signal S10 is smaller than the reference voltage Vref, while it is low when the potential of the signal S10 is larger than the reference voltage Vref.

Next, we will describe the structure of the duty-ratio detecting circuit 2. The duty-ratio detecting circuit 2 has a CMOS inverter structure including transistors MP4 and MN4. The feedback clock signal S2 is fed to both gates of the transistors MP4 and MN4. The source of the transistor MP4 is connected via a constant current source IS1 to the power supply VDD, while the source of the transistor MN4 is grounded via a constant current source IS2. Further, the drains of the transistors MP4 and MN4 are connected with each other from which the signal S8 is output. In this fashion, the duty-ratio detecting circuit 2 acts as a charge pump for converting the feedback clock signal S2 appearing as a voltage into the signal S8 appearing as a current.

Next, we will describe the structure of the duty-ratio correction filter 3. The duty-ratio correction filter 3 includes a serially-connected body consisting of a capacitor C2 and a resistance R1. One end of the capacitor C2 is grounded, and one end of the resistance R1 receives the signal S8. The potential of that end of the resistance R1 is applied to the gate of the transistor MN3 in the rising-edge control circuit 1a, as the control signal S9.

Now, we will describe the operation of the duty-ratio correction circuit DRC1 with the rising-edge control circuit 1a. When the signal S6 to the rising-edge control circuit 1a is low, the transistor MP1 is turned on and the capacitor C1 is charged with the power supply VDD via the transistors MP2 and MP3. Since the vias voltage VBP applied to the transistors MP2 and MP3 is constant, the capacitor C1 is charged with a constant amount of current and the rising time of the signal S10 is kept constant. When the signal S6 is high, on the other hand, the transistor MN1 is turned on and the capacitor C1 is discharged. Although the vias voltage applied to the transistor MN2 is constant, the transistor MN3 receives, at its gate, the control signal S9 from the duty-ratio correction filter 3. Thus, the speed in discharging the capacitor C1 varies according to the potential of the control signal S9.

Figure 4:
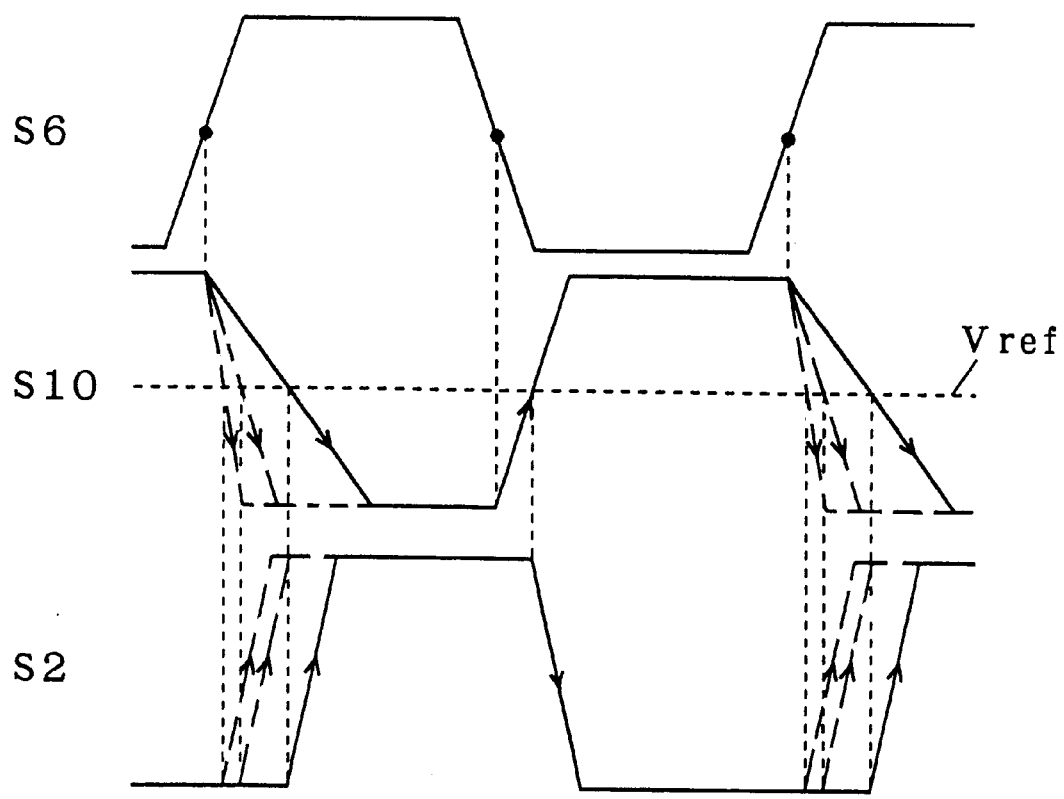
FIG. 4 is a timing chart of the operation according to the second preferred embodiment.

FIG. 4 is a timing chart showing variations of the signals S6, S10, and S2 according to the value of the control signal S9. Since the transistor MN3 is N-channel type, the speed of discharge increases as the potential of the control signal S9 increases, and thereby the potential of the signal S10 rapidly decreases. Accordingly, a time when the potential of the signal S10 becomes less than the reference potential Vref varies in response to the variation of the control signal S9. This varies the transition edge of the feedback clock signal S2, thereby gaining the control over the duty ratio.

The feedback clock signal S2 is fed to the duty-ratio detecting circuit 2. With a high-state feedback clock signal S2, the transistor MN4 is turned on and the duty-ratio detecting circuit 2 draws a charge stored in the duty-ratio correction filter 3 to the ground GND (discharge). With a low-state feedback clock signal S2, on the other hand, the transistor MP4 is turned on and the duty-ratio detecting circuit 2 supplies a charge to the duty-ratio correction filter 3 (charge). Therefore, the longer is the high period of the feedback clock signal S2, the lower is the potential of the control signal S9 from the duty-ratio correction filter 3. As a result, the gate potential of the transistor MN3 in the rising-edge control circuit 1a is reduced. This lowers the capability of the transistor MN3 to draw a charge and increases a time required for the fall of the signal S10, thereby delaying the start of a low to high transition of the feedback clock signal S2. On the other hand, a time required for the rise of the signal S10 is constant regardless of the potential of the control signal S9. Thus, a time lag in the falling edge between the feedback clock signal S2 and the signal S6 is also constant. Accordingly, the high period of the feedback clock signal S2 decreases while the low period thereof increases.

In this fashion, the feedback control over the duty ratio is gained. Thus, each circuit constant can be determined so as to stabilize the control signal S9 when the duty ratio of the feedback clock signal S2 is 1:1.

In the second preferred embodiment, the rising-edge control circuit 1a is used as the transition delay control circuit 1 in the duty-ratio correction circuit DRC1. Further, the phase-frequency detector 6 in the PLL or DLL circuit uses the falling edge to make the phase and the frequency comparisons between the input clock signal S1 and the feedback clock signal S2. This allows the control over the duty ratio to be independent from the control over the phase and the frequency.

3. Third Preferred Embodiment

Figure 5:
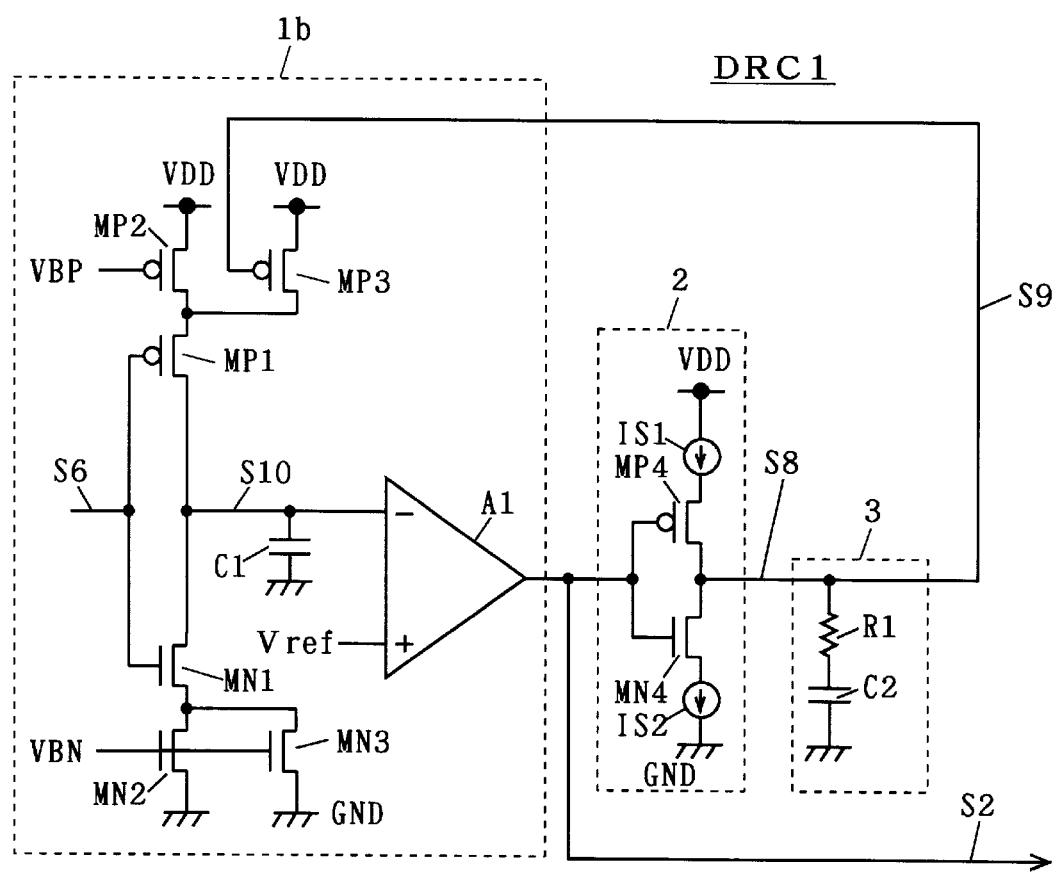
FIG. 5 shows a circuit configuration according to a third preferred embodiment of the present invention.

FIG. 5 shows another example of the structure of the duty-ratio correction circuit DRC1. In a third preferred embodiment, a falling-edge control circuit 1b is used as the transition delay control circuit 1. The duty-ratio correction circuit DRC1 also comprise the duty-ratio detecting circuit 2 and the duty-ratio correction filter 3. This circuit differs from the circuit shown in FIG. 3 in that the control signal S9 from the duty-ratio correction filter 3 is fed to the transistor MP3, not the transistor MN3, and in that the constant bias voltage VBN is applied to both of the gates of the transistors MN2 and MN3.

Figure 6:
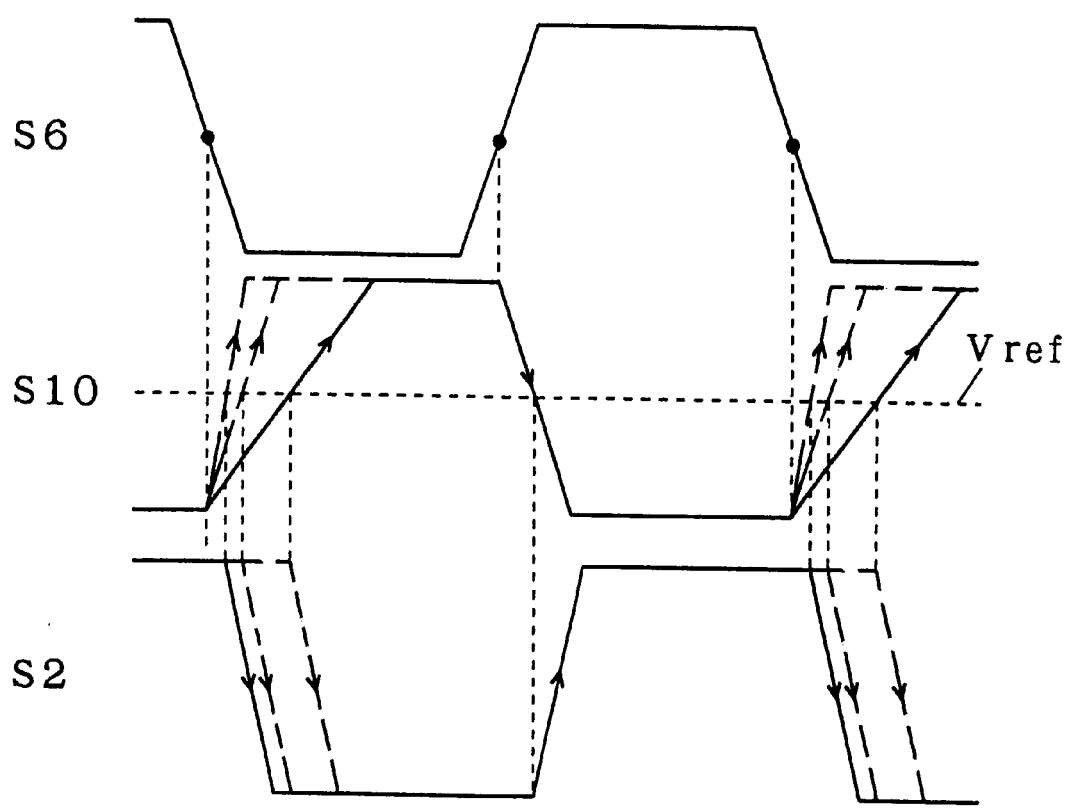
FIG. 6 is a timing chart of the operation according to the third preferred embodiment.

Contrary to the second preferred embodiment, in the third preferred embodiment, the control over the duty ratio is gained by controlling a time required for the rise of the signal S10 thereby to control the falling edge of the feedback clock signal S2. The operation of the circuit is as shown in FIG. 6. FIG. 6 is a timing chart of the signals S6, S10, and S2, with positive and negative of the voltage axis reversed from those in FIG. 4. Since the transistor MP3 is P-channel type, the speed in charging the capacitor C1 increases as the potential of the control signal S9 decreases, and thereby the potential of the signal S10 rapidly increases. Accordingly, a time when the potential of the signal S10 becomes more than the reference potential Vref varies in response to the variation of the control signal S9. This varies the transition edge of the feedback clock signal S2, thereby gaining the control over the duty ratio.

In the third preferred embodiment, the falling-edge control circuit 1b is used as the transition delay control circuit 1 in the duty-ratio correction circuit DRC1. Further, the phase-frequency detector 6 in the PLL or DLL circuit uses the rising edge to make the phase and the frequency comparisons between the input clock signal S1 and the feedback clock signal S2. This allows the control over the duty ratio to be independent from the control over the phase and the frequency.

4. Fourth Preferred Embodiment

Figure 7:
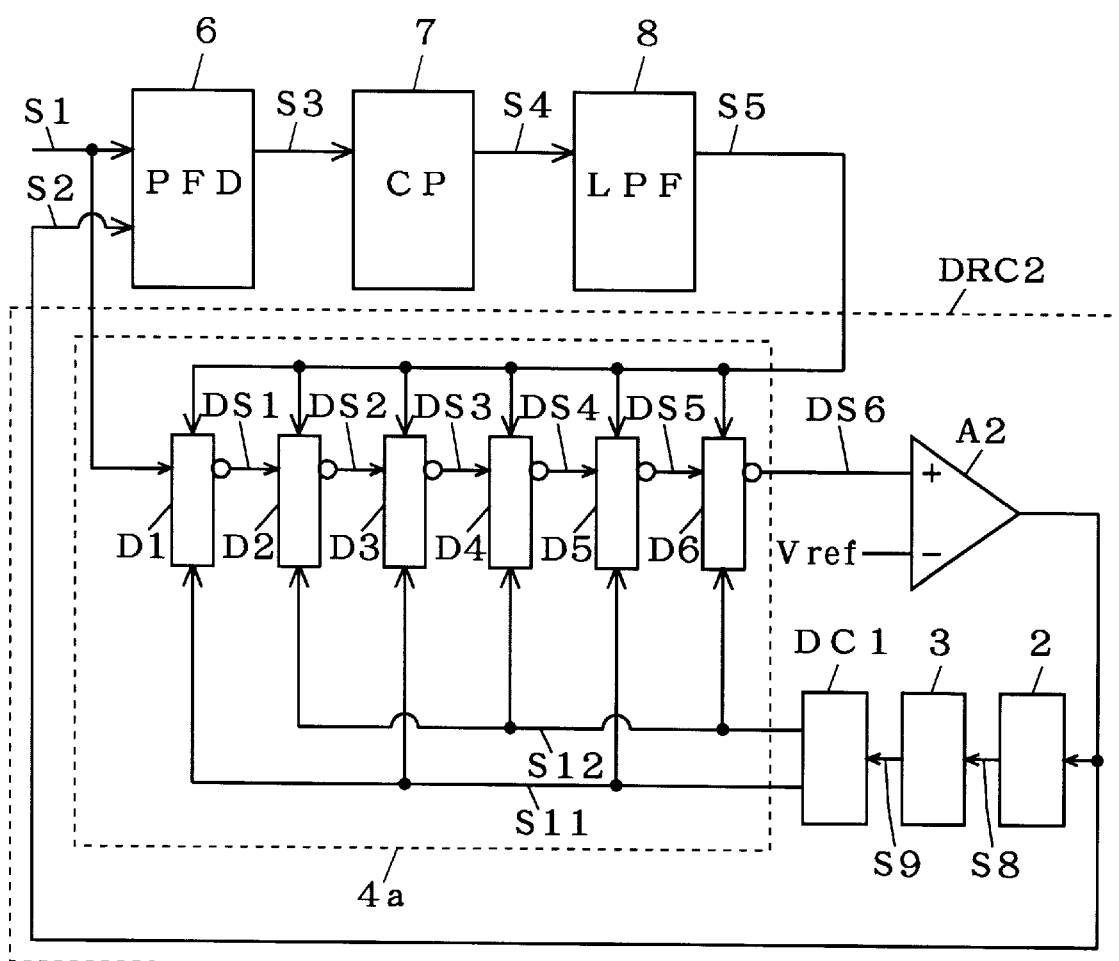
FIG. 7 shows a circuit configuration according to a fourth preferred embodiment of the present invention.

FIG. 7 shows the structure of a DLL circuit with a duty-ratio correction circuit DRC2 according to a fourth preferred embodiment of the present invention. Like the conventional DLL circuit, this circuit comprises the phase-frequency detector 6, the charge pump 7, and the low-pass filter 8. It, however, differs about a duty-ratio correction delay stage 4a. The duty-ratio correction delay stage 4a having a function to correct the duty ratio constitutes the duty-ratio correction circuit DRC2, together with a comparator A2, the duty-ratio detecting circuit 2, the duty-ratio correction filter 3, and a delay control signal generation circuit DC1.

The duty-ratio correction delay stage 4a includes a serially-connected body consisting of delay control inverters D1 to D6 (in this case, a six-stage delay control inverter). In those inverters, the amount of delay is controlled by the signal S5 and the control signal S9. First, the input clock signal S1 is fed to the first-stage delay control inverter D1 in which the signal is inverted and output to the second-stage delay control inverter D2 as a delay signal DS1. In a similar fashion, delay signals DS2 to DS6 are outputted from the delay control inverters D2 to D6, respectively.

When the number of delay control inverters is even as shown in FIG. 7, the signal DS6 from the last-stage delay control inverter D6 is fed to a positive input end of the comparator A2, while the reference potential Vref is applied to a negative input end thereof. This is because, contrary to the comparator A1 in the second and the third preferred embodiments, the feedback clock signal S2 which is an output signal of the comparator A2 should be high when the potential of the signal DS6 to the positive input end is more than the reference potential Vref, while it should be low when the potential of the signal DS6 is less than the reference potential Vref.

The duty-ratio detecting circuit 2 inputs the feedback clock signal S2 and generates the signal S8 by drawing and passing a constant amount of current during the high period and the low period of the feedback clock signal S2, respectively, as in the first preferred embodiment. The signal S8 is fed to the duty-ratio correction filter 3 and converted into a smooth voltage as in the first preferred embodiment. This smooth voltage serves as the control signal S9. The delay control signal generation circuit DC1 generates a rise-time control signal S11 and a fall-time control signal S12 on the basis of the control signal S9.

When the falling edge and the rising edge of the input clock signal S1 are used for the control over the duty ratio and for the control over the phase and the frequency, respectively, for example, the rise-time control signal S11 is fed to each of the odd-numbered delay control inverters D1, D3, and D5 and the fall-time control signal S12 is fed to each of the even-numbered delay control inverters D2, D4, and D6.

Figure 8:
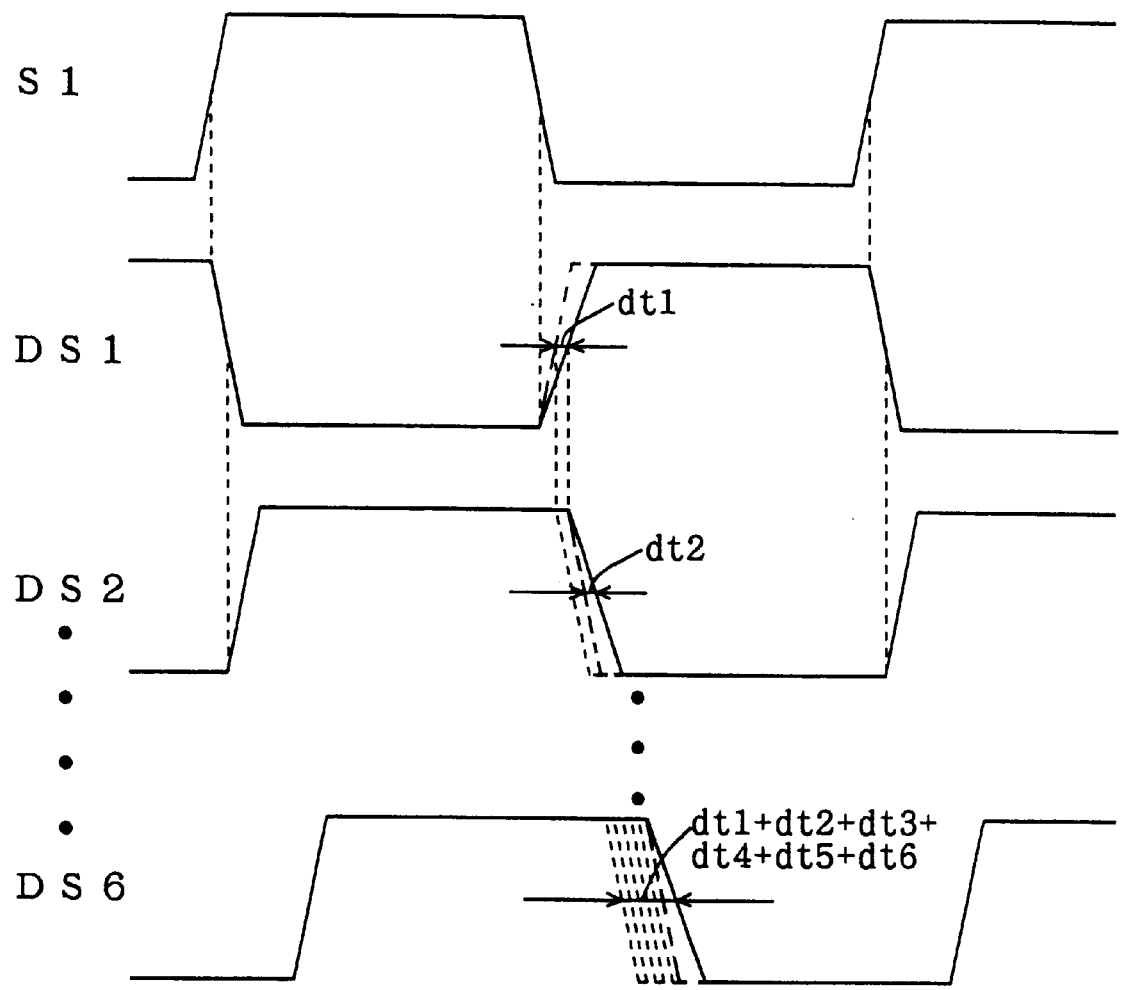
FIG. 8 is a timing chart of the operation according to the fourth preferred embodiment.

FIG. 8 is a timing chart of the operation of the duty-ratio correction circuit DRC2. Referring to the drawing, we will now describe the operation of the DLL circuit with the duty-ratio correction circuit DRC2. Assume that each of the delay control inverters D1 to D6 starts its transition when the input signal takes on an intermediate value between high and low.

First, the signal DS1 is output from the first stage delay control inverter D1 behind the input clock signal S1, as logical inversion of the input clock signal S1. At this time, the first-stage delay control inverter D1 varies a time required for the rise of the signal DS1 according to the potential of the rise-time control signal S11. On the other hand, a time required for the fall of the signal DS1 is kept constant regardless of the potential of the rise-time control signal S11. In FIG. 8, a time for the signal DS1 to rise to an intermediate value between high and low is increased by dt1, as compared with the fastest case. That is, the low period of the signal DS1 increases.

Then, a signal DS2 is output from the second-stage delay control inverter D2 behind the signal DS1, as logical inversion of the signal DS1. At this time, the second-stage delay control inverter D2 varies a time required for the fall of the signal DS2 according to the potential of the fall-time control signal S12. On the other hand, a time required for the rise of the signal DS2 is kept constant regardless of the potential of the fall-time control signal S12. In FIG. 8, a time for the signal DS2 to fall to an intermediate value between high and low is increased by dt2, as compared with the fastest case. That is, the high period of the signal DS2 increases. Further, the falling edge of the signal DS2 is also affected by the increment dt1 in the rise time obtained by the first-stage delay control inverter D1.

Therefore, as shown in the waveform in FIG. 8, the high period of the signal DS6 obtained through the six-stage delay control inverter in FIG. 7 is increased by dt1+dt2+dt3+dt4+dt5+dt6, i.e., variations in the rise time and the fall time for the six delay control inverters, as compared with the high period of the input clock signal S1 in the first-stage delay control inverter. Besides, a time lag (the amount of delay) in the rising edge between the input clock signal S1 and the signal DS6 is dependent only on the signal S5, independent from the rise-time control signal S11 and the fall-time control signal S12. Thus, the amount of delay is also independent from the control signal S9. Consequently, a similar effect to that of the first preferred embodiment can be obtained with the greatly varied duty ratio of the signal DS6 by comparing the rising edges of the input clock signal S1 and the feedback clock signal S2 to control the phase and the frequency of the signal DS6.

While the circuit shown in FIG. 7 uses a six-stage delay control inverter, the number of delay control inverters may be increased. In this case, the effect proportional to the number of delay control inverters will be obtained.

When the number of delay control inverters is odd, on the other hand, the duty ratio will be varied by applying the reference potential Vref to the positive input end of the comparator A2 and the output signal of the final-stage delay control inverter to the negative input end, and by bringing the input clock signal S1 and the feedback clock signal S2 in phase. In this case, also, the first-stage delay control inverter D1 uses the falling edge of the input clock signal S1 to control a time required for the rise of the signal DS1.

Figure 9:
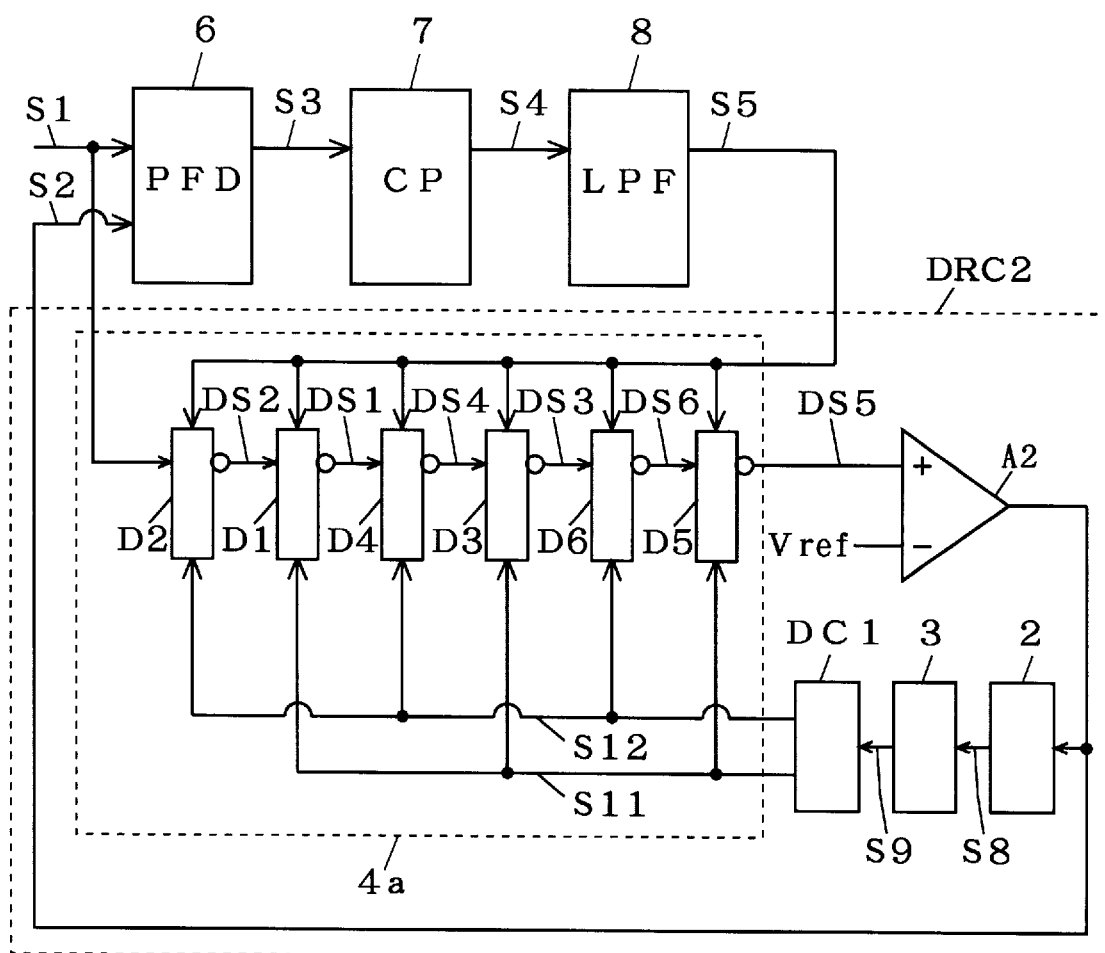
FIG. 9 shows another circuit configuration according to the fourth preferred embodiment.
Figure 10:
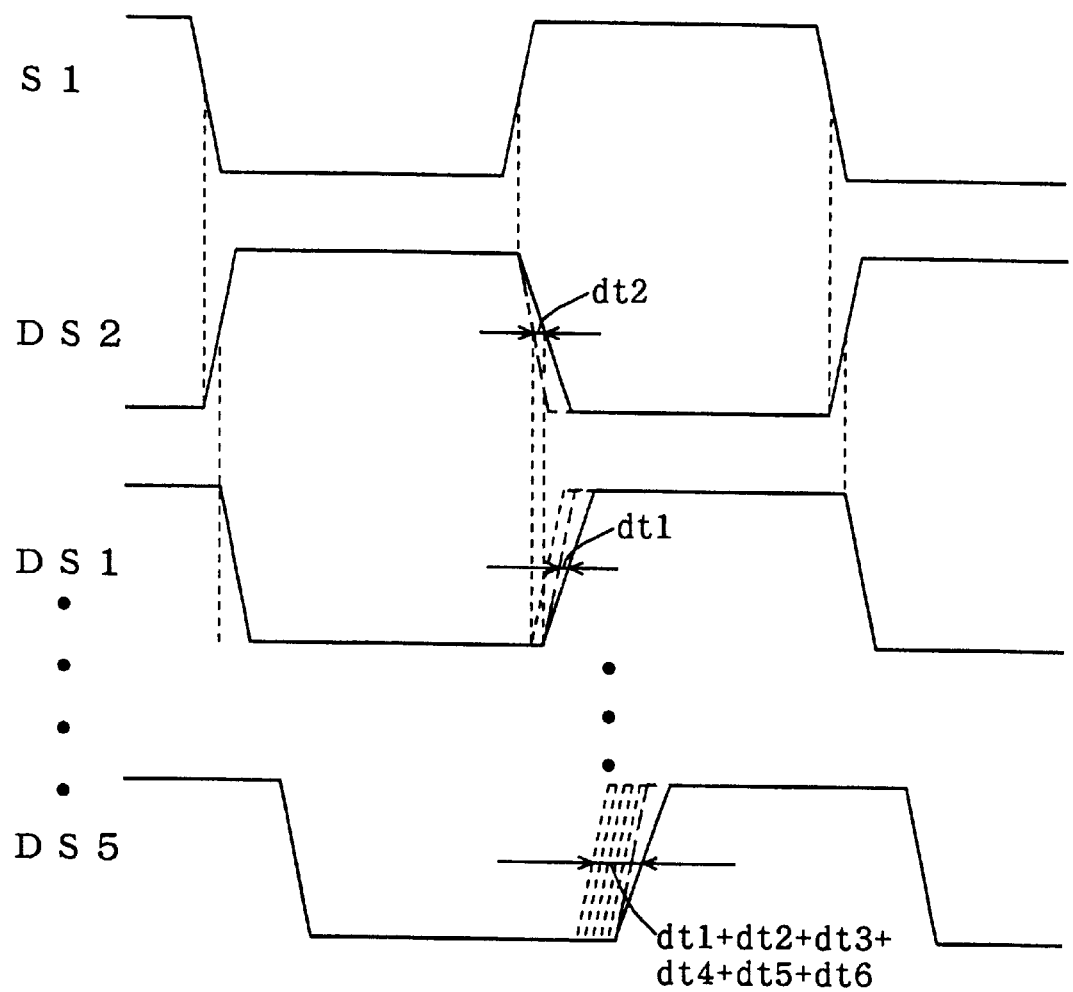
FIG. 10 is a timing chart of the operation according to the fourth preferred embodiment.

On the contrary, when the phase-frequency detector 6 uses the falling edges of the input clock signal S1 and the feedback clock signal S2 for the phase and frequency comparisons, the rising edge of the input clock signal S1 is used to vary a time required for the fall of a signal outputted from the delay control inverter, as shown in FIG. 10. In this case, the duty-ratio correction circuit DRC2 comprises the duty-ratio correction delay stage 4a with the first-stage delay control inverter D1 interchanged with the second-stage delay control inverter D2, the third-stage delay control inverter D3 with the fourth-stage delay control inverter D4, and the fifth-stage delay control inverter D5 with the sixth-stage delay control inverter D6 as shown in FIG. 9. Thus, as shown in the waveform in FIG. 10, the low period of the signal DS5 from the duty-ratio correction delay stage 4a is increased by dt1+dt2+dt3+dt4+dt5+dt6, i.e., variations in the rise time and the fall time for the six delay control inverters, as compared with the low period of the input clock signal S1.

In the duty-ratio correction circuit DRC2 according to the fourth preferred embodiment, the transition edge used for the control over the duty ratio by the duty-ratio correction circuit DRC2 is different from that used for the control over the phase and the frequency by the phase-frequency detector 6, the charge pump 7, and the low-pass filter 8. Thus, neither feedback affects the other. Accordingly, the circuit can rapidly stabilize itself while controlling both the duty ratio, and the phase and frequency.

Further, the feedback clock signal S2 can be outputted with its duty ratio greatly varied.

5. Fifth Preferred Embodiment

Figure 11:
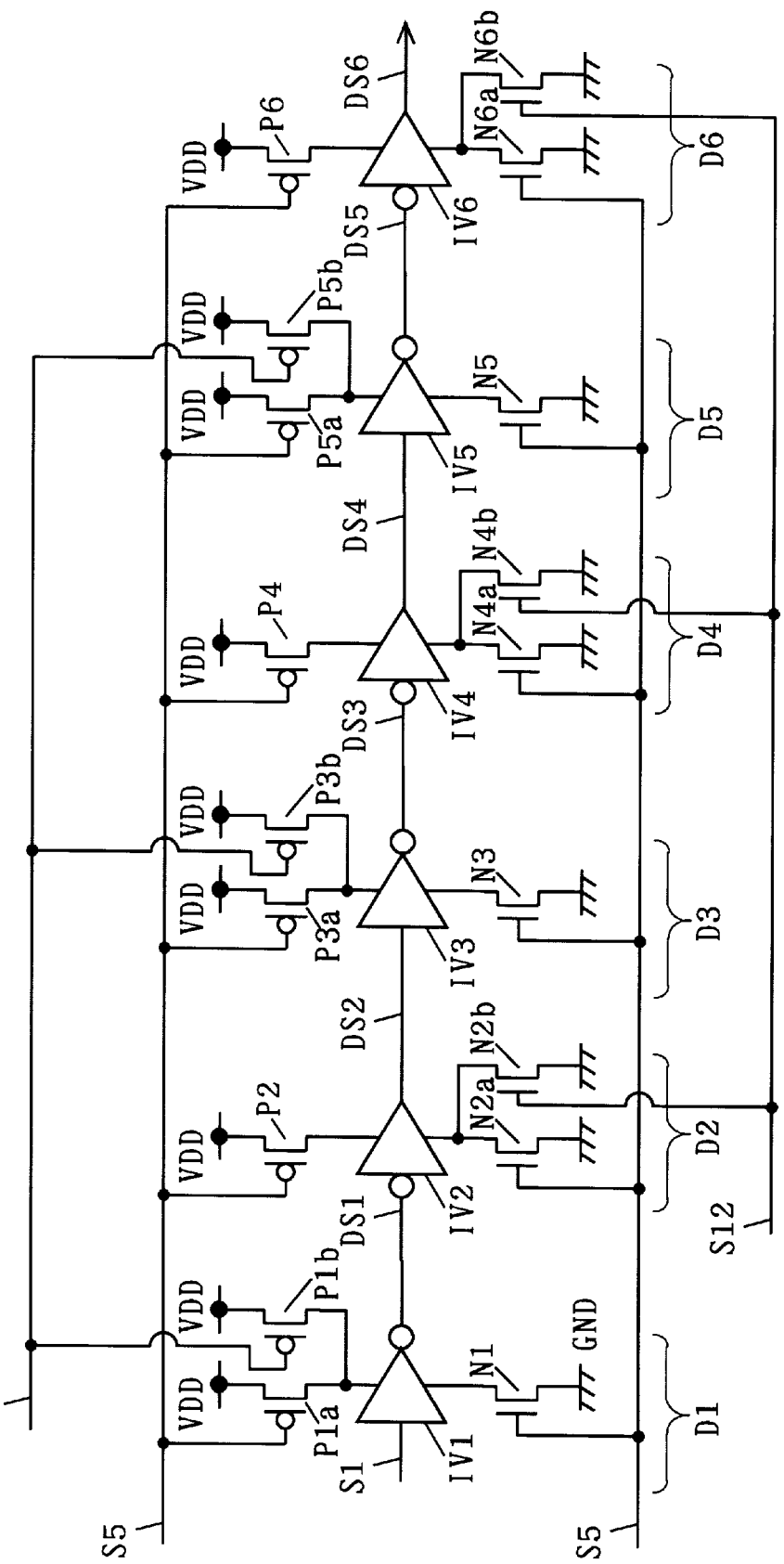
FIG. 11 shows a circuit configuration according to a fifth preferred embodiment of the present invention.

FIG. 11 shows an example of the duty-ratio correction delay stage 4a according to the fourth preferred embodiment. We will describe a case where the falling edge and the rising edge are used for the control over the duty ratio and for the control over the phase and the frequency, respectively (c.f. FIG. 7).

First, the structure of an odd-numbered delay control inverter, e.g., the first-stage delay control inverter D1, will be described. Like a well-known delay control inverter, a negative power end of an inverter IV1 is grounded via a transistor N1, and a positive power end thereof is connected via a transistor P1a to the power supply VDD. The signal S5 from the low-pass filter 8 is fed to both gates of the transistors P1a and N1. In addition to the well-known structure of the conventional delay control inverter, the first-stage delay control inverter D1 further comprises a transistor P1b connected in parallel to the transistor P1a. The transistor P1b receives the rise-time control signal S11 at its gate. The inverter IV1 receives the input clock signal S1 at its input end, and is connected to the input end of the next-stage inverter IV2 at its output end.

Next, the structure of an even-numbered delay control inverters, e.g., the second-stage delay control inverter D2, will be described. Like the well-known delay control inverter, a negative power end of the inverter IV2 is grounded via a transistor N2a and a positive power end thereof is connected via a transistor P2 to the power supply VDD. The signal S5 from the low-pass filter 8 is fed to both gates of the transistors N2a and P2. In addition to the structure of the well-known delay inverter, the second-stage delay control inverter D2 further comprises a transistor N2b connected in parallel with the transistor N2a. The transistor N2b receives the fall-time control signal S12 at its gate. The inverter I2 receives the signal DS1 at its input end, and is connected to the input end of the next-stage inverter IV3 at its output end.

Figure 12:
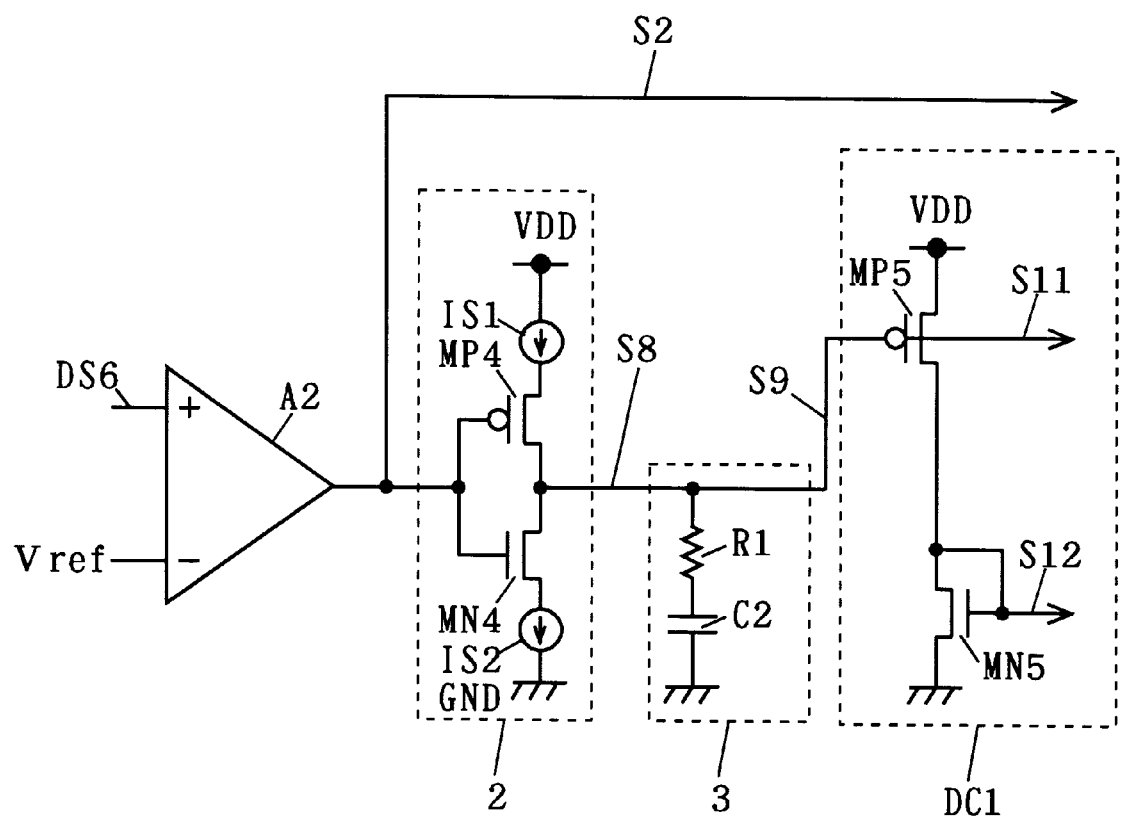
FIG. 12 shows another circuit configuration according to the fifth preferred embodiment.
Figure 13:
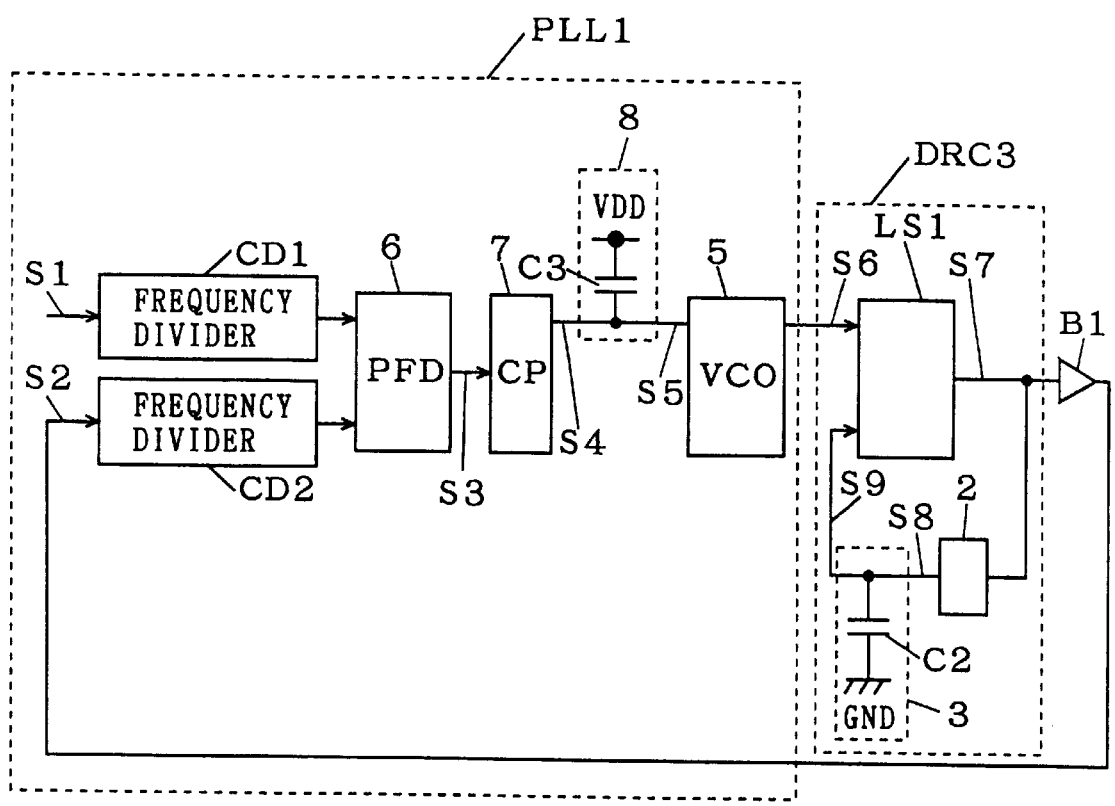
FIG. 13 shows a circuit configuration according to a conventional technique.
Figure 14:
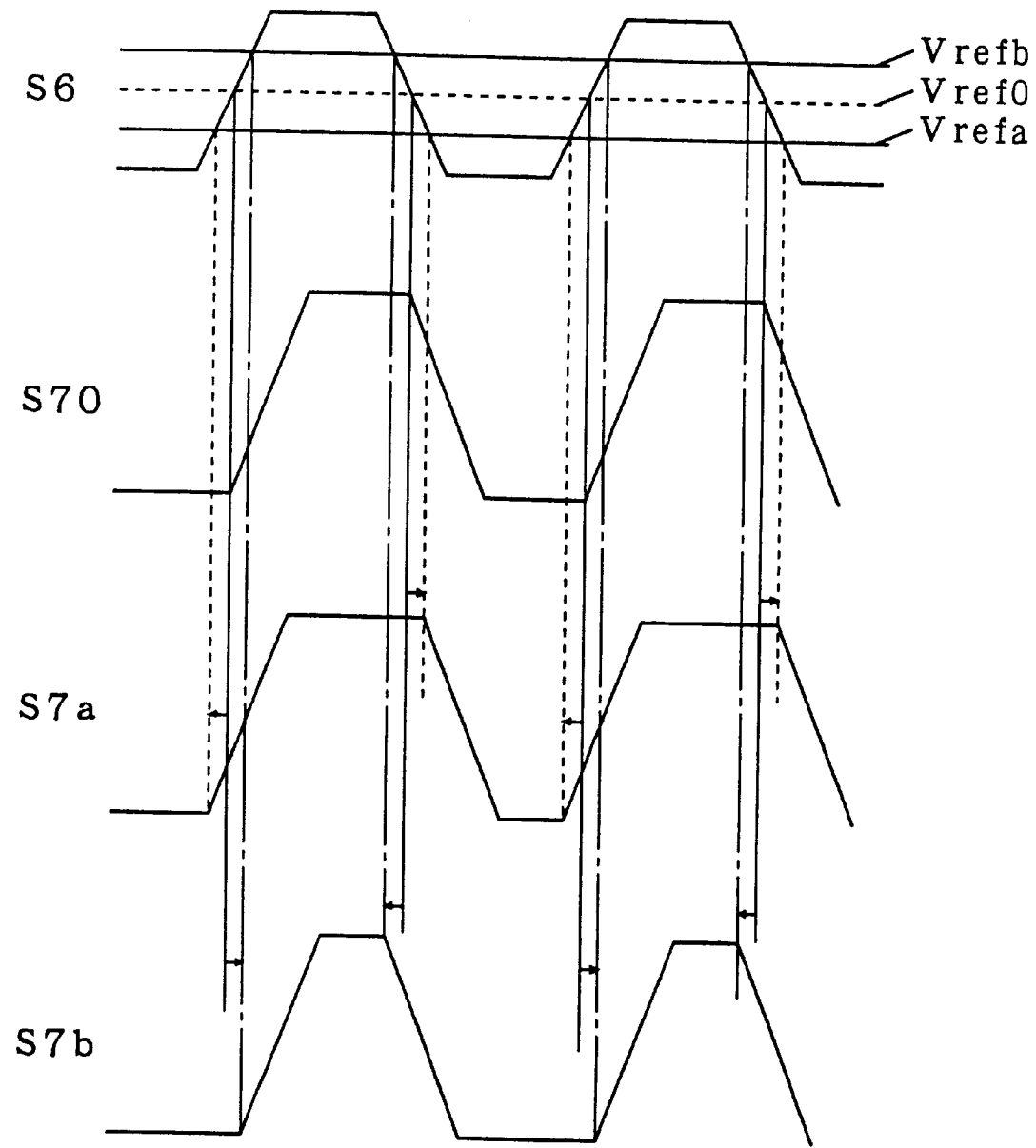
FIG. 14 is a timing chart of the operation according to the conventional technique.

FIG. 12 shows the duty-ratio detecting circuit 2, the duty-ratio correction filter 3, and the delay control signal generation circuit DC1 according to the fourth preferred embodiment. The duty-ratio detecting circuit 2 and the duty-ratio correction filter 3 are identical to those of the second and the third preferred embodiments, so the descriptions thereof will be omitted.

The delay control signal generation circuit DC1 consists of transistors MP5 and MN5 whose drains are connected with each other. The source of the transistor MP5 is connected to the power supply VDD, while the source of the transistor MN5 is grounded. The gate and the drain of the transistor MN5 are short-circuited. Further, the transistor MP5 receives the control signal S9 from the duty-ratio correction filter 3 at its gate. The gate potentials of the transistors MP5 and MN5 serve as the rise-time control signal S11 and the fall-time control signal S12, respectively.

In terms of the combination of the delay control signal generation circuit DC1 and an odd-numbered delay control inverter, e.g., the first-stage delay control inverter D1, current is supplied via the rise-time control signal S11 to the transistor P1b in response to the current flowing through the transistor MP5. Thus, the amount of delay in the inverter IV1 is controlled by the control signal S9. In terms of the combination of the delay control signal generation circuit DC1 and an even-numbered delay control inverter, e.g., the second-stage delay control inverter D2, on the other hand, current is supplied via the fall-time control signal S12 to the transistor N2b in response to the current flowing through the transistor MN5. Thus, the amount of delay in the inverter IV2 is controlled by the control signal S9. Therefore, the amount of delay can be controlled as described in the fourth preferred embodiment.

While the invention has been described in detail, the foregoing description is in all aspects illustrative and not restrictive. It is understood that numerous other modifications and variations can be devised without departing from the scope of the invention.

I claim:

1. A duty-ratio correction circuit comprising:
   an inverter with an input end receiving a clock, an output end, a first power supply end, a second power supply end, a first current source connected to said first power supply end, and a second current source connected to said second power supply end; and
   a comparator for comparing a potential of said output end of said inverter with a reference value to output a two-state output signal for controlling a driving force of only one of said first current source and said second current source.

2. The duty-ratio correction circuit according to claim 1, further comprising:
   a control signal generation circuit for generating a control signal by smoothing a variation in said output signal, said control signal controlling the amount of current supplied through either of said first current source or said second current source.

3. A duty-ratio correction circuit comprising:

an inverter with an input end receiving a clock, an output end, a first power supply end, a second power supply end, a first current source connected to said first power supply end, and a second current source connected to said second power supply end; and a comparator for comparing a potential of said output end of said inverter with a reference value to output a two-state output signal for controlling a driving force of either said first current source or said second current source; and a control signal generation circuit for generating a control signal by smoothing a variation in said output signal, wherein said control signal controls the amount of current supplied through either of said first current source or said second current source, and said control signal generation circuit includes:

a charge pump circuit with an input end receiving said output signal and an output end, for drawing a first current from said output end thereof when the potential of said output signal corresponds to a first logical value or for passing a second current to said output end thereof when the potential of said output signal corresponds to a second logical value which is complementary to said first logical value; and a filter for smoothing and outputting a charge on said output end of said charge pump circuit, wherein the amount of electricity based on a charge outputted from said filter serves as said control signal.

4. A duty-ratio correction circuit comprising a plurality of inverters connected in series, each having an input end, an output end, a first power supply end, and a second power supply end, one end of said plurality of inverters receiving a clock signal and another end of said plurality of inverters outputting a first output signal;

a plurality of first current sources respectively connected to the first power supply end of said plurality of inverters;

a plurality of second current sources respectively connected to the second power supply end of said plurality of inverters;

a comparator for comparing a potential of the first output signal with a reference value to output a second output signal, and a control signal generation circuit for generating first and second control signals on the basis of the second output signal from said comparator, wherein driving forces of the first current sources connected to alternate inverters of said plurality of inverters are controlled in accordance with the first control signal, and driving forces of the second current sources connected to the rest of said plurality of inverters are controlled in accordance with the second control signal.

5. The duty-ratio correction circuit according to claim 4, wherein said control signal generation circuit includes:

a charge pump circuit with an input end receiving said second output signal and an output end, for drawing a first current from said output end thereof when the potential of said second output signal is a first value or for passing a second current to said output end thereof when the potential of said second output signal is a second value;

a filter connected to said output end of said charge pump circuit and generating a third output signal; and a signal generation circuit for generating said first and second control signals on the basis of said third output signal from said filter.

6. A clock generation circuit for generating an output clock taking on first and second logical values in synchronization with a reference clock taking on said first and said second logical values, comprising:

an intermediate clock generation portion for generating an intermediate clock taking on said first and said second logical values on the basis of a comparison between said reference clock and said output clock concerning a first transition from said first logical value to said second logical value; and an output clock generation portion for outputting said output clock by producing a controllable delay in a second transition from said second logical value to said first logical value of said intermediate clock.

7. The clock generation circuit according to claim 6, wherein said output clock generation portion includes:

a transition delay control circuit for generating said output clock by delaying said second transition of said intermediate clock on the basis of a control signal; and a control signal generation circuit for generating said control signal on the basis of a duty ratio of said output clock.

8. The clock generation circuit according to claim 7, wherein said control signal generation circuit includes:

a charge pump circuit with an input end receiving said output clock and an output end, for drawing a first current from said output end thereof when the potential of said output clock corresponds to said first logical value or for passing a second current to said output end thereof when the potential of said output clock corresponds to said second logical value; and a filter for smoothing and outputting a charge on said output end of said charge pump circuit, wherein the amount of electricity based on a charge output from said filter serves as said control signal.

9. The clock generation circuit according to claim 7, wherein said transition delay control circuit includes:

an inverter with an input end receiving said intermediate clock, an output end, a first current source which is, when said intermediate clock takes on said first logical value, to be connected to said output end to supply a current on the basis of said control signal, and a second current source which is, when said intermediate clock takes on said second logical value, to be connected to said output end to supply a first constant current; and a comparator for comparing a potential of said output end of said inverter with a reference value to output a two-state output signal, wherein a current supplied through said first current source and a current supplied through said second current source are opposite in direction at said output end of said inverter, and wherein said output signal of said comparator serves as said output clock.

10. The clock generation circuit according to claim 9, wherein said control signal generation circuit includes:

a charge pump circuit with an input end receiving said output clock and an output end, for drawing a first current from said output end thereof when the potential of said output clock corresponds to said first logical value or for passing a second current to said output end thereof when the potential of said output clock corresponds to said second logical value; and a filter for smoothing and outputting a charge on said output end of said charge pump circuit, wherein the amount of electricity based on a charge output from said filter serves as said control signal.

11. A clock generation circuit for generating an output clock taking on first and second logical values in synchronization with a reference clock taking on said first and said second logical values, comprising:

a first comparator for making a comparison between said reference clock and said output clock concerning a first transition from said first logical value to said second logical value, to output a comparison result;

a delay circuit with a first delay element and a second delay element, for outputting an intermediate clock on the basis of a second delay signal, said first delay element generating a first delay signal by inverting said reference clock while delaying a second transition from said second logical value to said first logical value of said reference clock by a first amount of delay based on said comparison result given by said first comparator and a first delay control signal, said second delay element generating said second delay signal by inverting said first delay signal while delaying said first transition of said first delay signal by a second amount of delay based on said comparison result given by said first comparator and a second delay control signal;

a second comparator for comparing said intermediate clock with a reference value to generate said output clock; and a control signal generation circuit for generating said first and said second delay control signals on the basis of a duty ratio of said output clock.

12. The clock generation circuit according to claim 11, wherein said control signal generation circuit includes:

a smoothing circuit for smoothing and outputting said output clock; and a delay control signal generation circuit for outputting said first and said second delay control signals on the basis of a charge output from said smoothing circuit.

13. The clock generating circuit according to claim 11, wherein said first delay element includes:

an inverter with an input end receiving said reference clock, an output end outputting said first delay signal, a first power supply end, and a second power supply end;

a first current source for supplying a current controlled by said comparison result given by said first comparator and said first delay control signal, to said first power supply end of said inverter; and a second current source for supplying a current controlled by said comparison result given by said first comparator, to said second power supply end of said inverter.

14. The clock generation circuit according to claim 13, wherein said control signal generation circuit includes:

a smoothing circuit for smoothing and outputting said output clock; and a delay control signal generation circuit for outputting said first and said second delay control signals on the basis of a charge output from said smoothing circuit.

15. The clock generation circuit according to claim 11 wherein said second delay element includes:

an inverter with an input end receiving said first delay signal, an output end outputting said second delay signal, a first power supply end, and a second power supply end;

a first current source for supplying a current controlled by said comparison result given by said first comparator, to said first power supply end of said inverter; and a second current source for supplying a current controlled by said comparison result given by said first comparator and said second delay control signal, to said second power supply end of said inverter.

16. The clock generation circuit according to claim 15, wherein said control signal generation circuit includes:

a smoothing circuit for smoothing and outputting said output clock; and a delay control signal generation circuit for outputting said first and said second delay control signals on the basis of a charge output from said smoothing circuit.

17. A duty-ratio correction circuit comprising:

an inverter having an input end receiving a clock, an output end, a first power supply end, and a second power supply end;

a first current source connected to said first power supply end;

a second current source connected to said second power supply end;

a comparator for comparing a potential of said output end of said inverter with a constant reference value to output an output signal which is applied to another circuit;

a charge pump circuit with an input end receiving said output signal and an output end, for drawing a first current from said output end thereof when a potential of said output signal is a first value or for passing a second current to said output end thereof when the potential of said output signal is a second value; and a filter connected to said output end of said charge pump circuit and generating a control signal for controlling a driving force of said first current source.

18. The duty-ratio correction circuit according to claim 17, wherein said first current source includes a PMOS transistor having a source receiving a first potential, a drain connected to said inverter and a gate receiving the control signal from said filter, and said second current source includes an NMOS transistor having a source receiving a second potential lower than the first potential, a drain connected to said inverter and a gate.

19. The duty-ratio correction circuit according to claim 17, wherein
said first current source includes an NMOS transistor having a source receiving a first potential, a drain connected to said inverter and a gate receiving the control signal from said filter, and
said second current source includes a PMOS transistor having a source receiving a second potential higher than the first potential, a drain connected to said inverter and a gate.

20. The duty-ratio correction circuit according to claim 17, wherein
said charge pump includes a PMOS transistor having a gate receiving the output signal from said comparator, a drain connected to the output end of said charge pump and a source,
an NMOS transistor having a gate receiving the output signal from said comparator, a drain connected to the output end of said charge pump and a source,
a third current source for supplying a current to said source of the PMOS transistor, and
a fourth current source for supplying a current to said source of the NMOS transistor.

* * * * *